United States Patent
Hawrylchak et al.

(10) Patent No.: US 10,689,757 B2
(45) Date of Patent: Jun. 23, 2020

(54) GAS INJECTION APPARATUS WITH HEATING CHANNELS

(71) Applicant: Applied Materials, Inc., Santa Clara, CA (US)

(72) Inventors: Lara Hawrylchak, Gilroy, CA (US); Agus Sofian Tjandra, San Jose, CA (US); Emre Cuvalci, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 207 days.

(21) Appl. No.: 15/859,035

(22) Filed: Dec. 29, 2017

(65) Prior Publication Data

US 2018/0187305 A1 Jul. 5, 2018

Related U.S. Application Data (60) Provisional application No. 62/441,710, filed on Jan. 3, 2017.

(51) Int. Cl.
*H01M 8/04* (2016.01)
*C23C 16/455* (2006.01)
*C23C 16/458* (2006.01)

(52) U.S. Cl.
CPC ...... *C23C 16/4557* (2013.01); *C23C 16/4584* (2013.01); *C23C 16/45587* (2013.01)

(58) Field of Classification Search
CPC .......... C23C 16/4557; C23C 16/45587; C23C 16/4584
See application file for complete search history.

(56) References Cited

U.S. PATENT DOCUMENTS

| | | | |
|---|---|---|---|
| 3,818,374 A | 6/1974 | Emanuel | |
| 7,252,716 B2 | 8/2007 | Kim et al. | |
| 7,947,561 B2 | 5/2011 | Mani et al. | |
| 9,157,730 B2 | 10/2015 | Rajagopalan et al. | |
| 2014/0034632 A1 | 2/2014 | Pan et al. | |
| 2014/0216585 A1* | 8/2014 | Tjandra ............. | H01L 21/67017 137/896 |
| 2014/0273409 A1 | 9/2014 | Pitney et al. | |
| 2016/0273108 A1 | 9/2016 | Ge et al. | |

FOREIGN PATENT DOCUMENTS

| | | |
|---|---|---|
| CN | 1501435 A | 6/2004 |
| CN | 105431928 A | 3/2016 |
| JP | 2016039356 A | 3/2016 |

OTHER PUBLICATIONS

International Search Report and Written Opinion dated Apr. 25, 2018 for Application No. PCT/US2017/069091.
Taiwan Office Action dated Mar. 12, 2020, for Taiwan Patent Application No. 107100032.

* cited by examiner

*Primary Examiner* — Jane J Rhee
(74) *Attorney, Agent, or Firm* — Patterson + Sheridan, LLP (57) ABSTRACT

A gas injection apparatus for a thermal processing chamber includes a gas injector having an inlet at a first end and a port at a second end; and a plate having a first opening matching the port, one or more second openings, and at least one circuitous flow path defined by the plate and fluidly connecting the first opening to the one or more second openings.

20 Claims, 7 Drawing Sheets

GAS INJECTION APPARATUS WITH HEATING CHANNELS

CROSS-REFERENCE TO RELATED APPLICATIONS

This application claims benefit of U.S. Provisional Patent Application Ser. No. 62/441,710, filed Jan. 3, 2017, which is incorporated herein by reference.

BACKGROUND

Field of the Invention

Embodiments of the present invention generally relate to methods and apparatus for processing semiconductor substrates. More specifically, embodiments of the present invention generally relate to methods and apparatus for oxygen for deposition on semiconductor substrates.

Description of the Related Art

Thermal CVD chambers are widely used in semiconductor manufacturing, and in other industries, to form film layers on substrates. Generally, the substrate is heated, for example using lamp electromagnetic radiation that heats the substrate, and the hot substrate is exposed to a gas mixture to perform a chemical reaction that forms a thin film on the substrate. Reactions occur in the gas space above the substrate and between species in the gas space and the substrate surface to form the thin film on the substrate. An exemplary process is the reaction of hydrogen gas and oxygen gas to form an oxide layer on the surface of a semiconductor substrate. Hydrogen gas and oxygen gas activate, decompose, and react together to form various active species in the gas space, and reactive species in the gas space react with semiconductor materials such as silicon and germanium on or within the substrate surface to form oxides of silicon and/or germanium. In the typical process, the reaction among the components in the gas mixture, and with the substrate surface, is primarily activated by the heat of the substrate, which may be conducted and radiated to the gas in various proportions depending on operating pressure and gas flow characteristics of the chamber. The gas can also absorb some heat directly from the lamp electromagnetic radiation.

In one category of thermal CVD chambers, the gas mixture is introduced thereinto through a side wall of the chamber near an edge of the substrate. The gas enters the chamber on one side and flows across the substrate to an exhaust on the opposite side of the chamber, absorbing heat from the substrate, and the surrounding chamber environment, and it resultantly rises in temperature. The substrate may be rotated while the gas is introduced into the chamber and is passing across the substrate. When a gas molecule reaches an activation temperature, it becomes activated, for example by ionizing, decomposing, or merely reaching an active quantum state. As the gas generally rises in temperature, some molecules in the gas become reactive enough for CVD reaction to begin, and the rate of reaction generally rises. If the reaction emits visible light, as the reaction rate rises, a reaction front can be viewed at the location(s) where a high enough concentration of gas molecules are activated, such that enough photons are emitted to be seen. Visibility of the reaction front thus indicates that a certain relatively high reaction rate has been achieved.

Commonly, the reaction front is located some distance from the edge of the substrate because it takes time for the gas temperature to rise to the activation temperature while flowing across the substrate. Distance between the substrate edge and the reaction front indicates that the substrate-gas reaction or the thin film formation rate is slow near the edge of the substrate where the gas is mostly too cool to react. Because the reaction proceeds faster nearer the center of the substrate than the edge due to the time required for the gas to rise to the activation temperature, as evidenced by the location of the reaction front, the resulting film formed on the substrate, or the surface modification thereof, is substantially non-uniform in thickness.

Non-uniformity in the surface modification or the thickness of the thin film formed in thermal CVD processes is increasingly disadvantageous in advanced manufacturing processes due to the variation in device properties arising from these variations. Therefore, what is needed is an apparatus and method for improving uniformity of thin film deposition thickness and surface modification in thermal CVD processes.

SUMMARY

In an embodiment, a gas injection apparatus for a processing chamber includes a gas injector having an inlet at a first end, a closed second end, and an extending conduit located between the first end and the second end; and a transparent manifold plate gas heater having an inlet that matches and fluidly couples to the extending conduit, one or more outlets, and one or more channels formed in the manifold plate gas heater and fluidly connecting the inlet of the manifold plate gas heater to the one or more outlets.

In another embodiment, a processing chamber includes a gas injection apparatus comprising a gas injector having an inlet at a first end, a closed second end, and an extending conduit located between the first end and the second end; and a transparent gas heating plate having a first major surface and a second major surface opposite the first major surface, a first opening that matches and fluidly couples to the extending conduit and a second opening, the transparent gas heating plate defining at least one circuitous gas flow path from the first opening to the second opening; and a radiant heat source facing the transparent gas heating plate.

In another embodiment, a processing chamber includes a chamber body having a side wall with a first gas inlet, a second gas inlet, and an exhaust opposite the second gas inlet; a substrate support disposed in the chamber body and defining a substrate processing plane proximate to the first and second gas inlets and the exhaust; a heat source facing the substrate support; a divider between the heat source and the substrate support; and a resistive gas heater coupled to the first gas inlet.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In a thermal CVD chamber having a radiant heat source that is used to heat a substrate during processing, a gas injection apparatus is utilized to provide reaction precursors, in a gas state, into a processing volume of the chamber. Here, the gas injection apparatus feeds one or more of the reaction precursors to an injection manifold that is heated by the heat source, to resultantly heat the one or more of the gaseous reaction precursors before they are injected into the processing volume of the chamber. The injection manifold is a gas heating plate, and includes channels that fluidly couple the gas injection apparatus to the processing volume of the chamber, so that one or more reaction precursors flow from the gas injection apparatus through the channels of the injection manifold and thence into the processing volume of the chamber. As the reaction precursors flow through the injection manifold, the reaction precursors absorb heat from the injection manifold, which is heated by the chamber heat source, here the radiant heat source. The channels provide an extended flow length to extend the time the gas is passing over a heated surface, thereby allowing the reaction precursors to rise in temperature before they are exposed to the substrate. The channels, in conjunction with outlets therefrom into the processing volume of the chamber, also provide the capability to direct the hot reaction precursors to desired locations of the substrate surface to promote uniform film layer deposition, or surface modification, on the exposed surface of the substrate. The channels are generally pathways through the injection manifold that provide enough residence time for the reaction precursors to achieve an elevated temperature while passing therethrough that is near, at, or above an activation temperature of the reaction precursors. Thus, the channels can be circuitous pathways through the injection manifold.

Figures 1A, 1B, 1C:
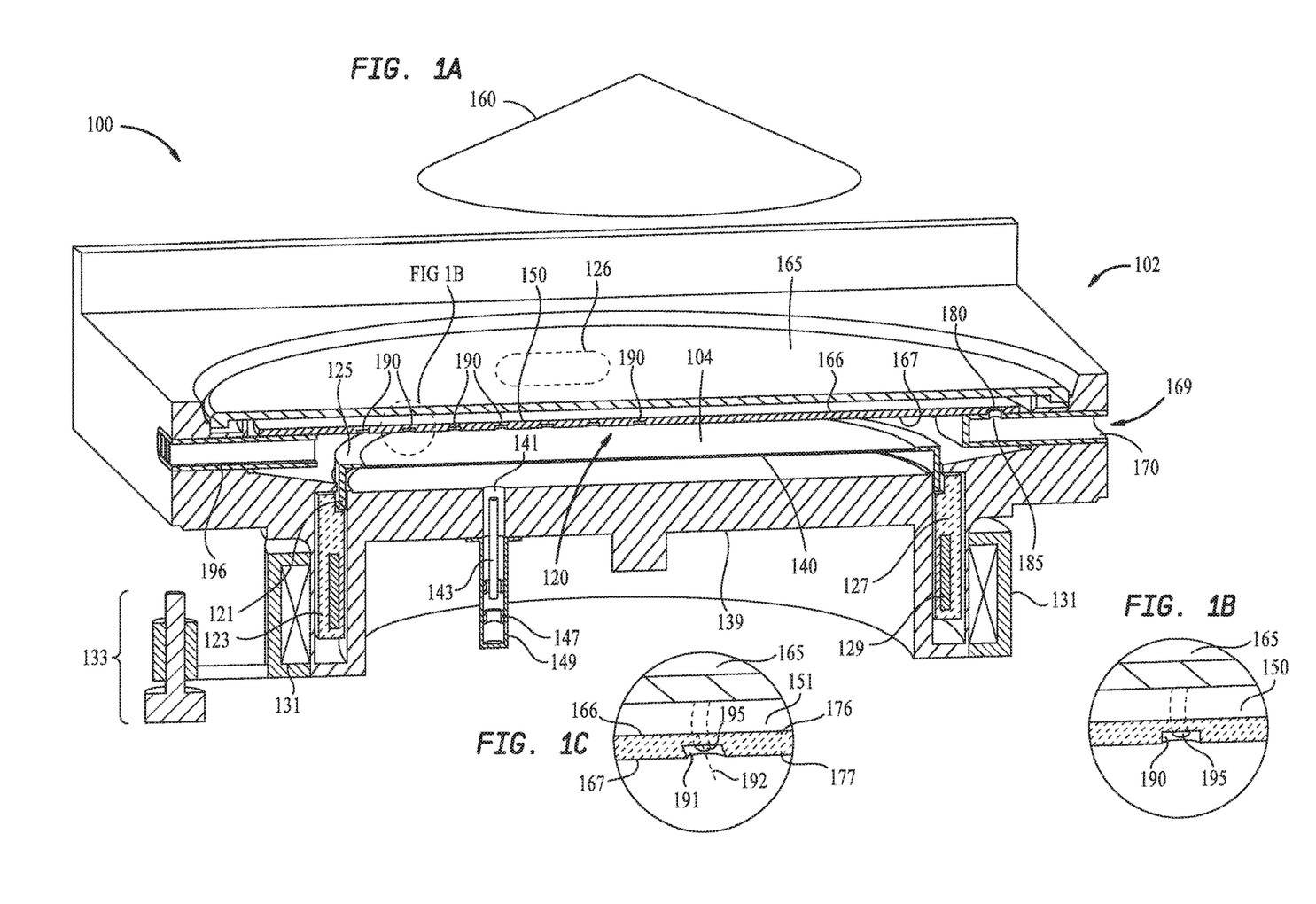
FIG. 1A is cross-sectional view of one embodiment of a thermal processing chamber.
FIG. 1B is a detailed view of a portion of the thermal processing chamber of FIG. 1A.
FIG. 1C is a detailed view of another embodiment of a manifold usable in the thermal processing chamber of FIG. 1A.

One example of a thermal CVD chamber that can benefit from such gas injection apparatus is a thermal semiconductor oxidation chamber. FIG. 1A is cross-sectional view of one embodiment of a thermal processing chamber 100 that can be used to perform a thermal oxidation process on a semiconductor substrate or on one or more film layers previously formed thereon. Aspects of the chamber 100 of FIG. 1A are similar to the RADIANCE®, RADIANCE® Plus, and RADOX® chambers available from Applied Materials, Inc., located in Santa Clara, Calif.

The processing chamber 100 includes a chamber body 102, and a substrate support 140 disposed within the chamber body 102. A radiant heat source 160 provides heat to activate the reactions of the reaction precursors with the substrate surface, and a divider 165 separates the heat source 160 from the processing environment. The radiant heat source 160 heats components and surfaces of the chamber 100 that receive electromagnetic radiation from the radiant heat source 160, and the heated components and surfaces, in turn, heat the reaction precursors. During processing, a substrate 104 is supported in a processing position by the substrate support 140. The substrate 104 and the divider 165 define a processing volume 120 within which the substrate 104 is exposed to reaction precursors. The heat source 160 emits visible and infrared radiation that heats chamber components and the substrate 104. In this case, the heat source 160 is a lamp assembly with a plurality of lamps that emit visible and infrared electromagnetic radiation which is absorbed by, and thereby heats, the substrate 104, along with the divider 165 and other surface and components of the chamber 100. Alternatively, solid state emitters, such as LEDs and lasers, can be used to emit electromagnetic radiation to heat the substrate 104. The divider 165 is substantially transparent to the electromagnetic radiation emitted by the heat source 160, but absorbs enough to be heated. Electromagnetic radiation that passes through the divider 165 reaches the substrate 104, heating the substrate 104. The divider 165 can be quartz or sapphire.

The substrate support 140 in FIG. 1A is a substrate edge support. A contact portion 125 of the substrate support 140 contacts the edge of the substrate 104, suspending the substrate 104 between a base 139 of the chamber 100 and the divider 165. A support portion 121 of the substrate support 140 extends away from the contact portion toward the base 139 and rests on a rotor 123, which can be rotated and thereby rotate the substrate 104 about its center on the diameter thereof during processing. The rotor 123 of FIG. 1A is a magnetically actuated rotor, with a non-magnetic envelope 127 thereof enclosing a magnetic core 129 therein, which magnetic core 129 is a permanent magnet. An electromagnetic stator 131 is disposed outside the chamber body 102 in registration with, and surrounding, the rotor 123. Electromagnets (not shown) in the stator 131 are operated to provide a rotating magnetic field that rotates the rotor 123 by magnetic coupling of the rotating magnetic field of the stator 131 with the magnetic core 129. A linear actuator 133 can be used to change the position of the stator 131 along a rotational axis of the rotor 123 such that the rotor 123 can be moved along its axis of rotation while it is rotating, or while it is not rotating. In this case, the linear actuator 133 is a lead screw drive with a lead screw coupled to a rotator and a threaded sleeve, which in turn is coupled by a support to the stator 131. In this way, the position of the substrate 104 in the chamber body 102 can be changed.

The substrate 104 is disposed in the chamber 100 and removed from the chamber 100 using lift pins 143. Although one lift pin 143 is visible in FIG. 1A, the chamber 100 has three lift pins 143. An opening 141 in the chamber base 139 provides access for the lift pin 143 to contact the substrate 104 and to retract into the chamber base 139 during processing. The lift pins 143 of the chamber 100 are disposed in an envelope 149 attached to the chamber base 139 at the opening 141. The envelope 149 encloses the opening 141 to maintain a seal around the opening 141. One or more compliant seal members (not shown) may be provided where the envelope 149 attaches to the chamber base 139. One or more actuators 147 are provided in the envelope 149. The actuators 147 in FIG. 1A are electromagnets, configured to provide magnetically coupled actuation for the lift pin 143. A power supply (not shown) for the electromagnets may be located along the chamber base 139 to access the lift pins 143. The power supply may be insulated against chamber heat if necessary. The lift pins 143 are extended toward the processing volume 120 for substrate loading and unloading. The lift pins 143 may extend into the processing volume 120, or the substrate support 140 may concurrently be lowered while the lift pins 143 are extended, in which case the lift pins 143 might not extend into the processing volume 120. The lift pins 143 move into contact with the substrate 104, and by motion of the lift pins 143 alone, or together with motion of the substrate support 140 by actuating the stator 131, the substrate 104 is separated from the substrate support 140 to provide access for a substrate handler (not shown) to receive the substrate 104 from the lift pins 143 and support the substrate 104 thereon for removal from the chamber body 102. The substrate handler removes the substrate from the chamber body 102 through a resealable door provided in the portion of the chamber body 102 removed by the cross-section of FIG. 1A. Substrates are also loaded into the chamber body 102 through the door. The substrate handler, having a substrate supported thereon, extends into the chamber 100 above the substrate support 140. The lift pins 143 extend to lift the substrate 104 off the substrate handler, which then exits the chamber 100. The lift pins 143 then retract to place the substrate on the substrate support 140. The substrate support 140 may also be moved to contact the substrate 104 and lift the substrate 104 off the lift pins 143. The lift pins 143 are then retracted toward the chamber base 139 and the substrate support is moved into processing position.

Delivery of reaction precursors to the chamber 100 is accomplished using two openings in the side wall of the chamber body 102. A first opening 169 is provided at a first location in the side wall for injecting a first gas, and a second opening 126 is provided at a second location in the side wall, different from the first location, for injecting a second gas. The first and second gases react together when an activation temperature is reached, so the first and second gases are injected at separate locations, and flow along different pathways to avoid unwanted premature reactions therebetween, and to allow one of the gas pathways to be heated, as further described below. In FIG. 1A, the first opening 169 and the second opening 126 are separated from each other by an angle of about 90° in the rotational direction of the substrate support 140.

The processing chamber 100 includes a manifold gas heating plate 150 that is disposed substantially parallel to a substrate processing plane defined by the substrate support 140, and a gas injector 170 that is disposed in the opening 169 and fluidly coupled to the manifold gas heating plate 150. The manifold gas heating plate 150 is located between the divider 165 and the substrate support 140. The manifold gas heating plate 150 is flat and disk-shaped, for example a plate with a first major surface 166 and a second major surface 167 opposite the first major surface 167, and has a diameter larger than the outer diameter of the substrate support 140. The manifold gas heating plate 150 is made from a material such as quartz or sapphire that allows radiation from the heat source 160 to pass through the manifold gas heating plate 150 to heat the substrate. The manifold gas heating plate 150 is thus substantially transparent. The manifold gas heating plate 150 also absorbs some electromagnetic radiation from the heat source 160, so the manifold gas heating plate 150 is also heated by the heat source 160.

The manifold gas heating plate 150 is located between the divider 165 and the substrate support 140, and the divider 165 is located between the manifold gas heating plate 150 and the heat source 160. The heat source 160 emits electromagnetic radiation toward the divider 165. The divider 165 allows electromagnetic radiation to pass through and reach the manifold gas heating plate 150. Some of the electromagnetic radiation emitted by the heat source is absorbed by the divider 165 and heats the divider 165, while some passes through the divider 165 to heat the substrate 104. To maintain a desired temperature of the divider 165, cooling may be provided to cool the divider 165, for example by circulating a cooling fluid through channels formed in the divider. Alternatively, a cooling fluid may be applied to the divider 165 on a surface thereof facing the heat source 160 or facing the manifold gas heating plate 150. Electromagnetic radiation that passes through the divider 165 reaches the manifold gas heating plate 150. Some of the electromagnetic radiation that reaches the manifold gas heating plate 150 is absorbed by the manifold gas heating plate 150 and heats the manifold gas heating plate 150, while some passes through the manifold gas heating plate 150. Electromagnetic radiation that passes through the manifold gas heating plate 150 reaches the substrate 104 and heats the substrate 104.

The manifold gas heating plate 150 rests on the gas injector 170 and on a manifold support 196 disposed in a recess of the chamber side wall opposite the opening 169 The gas injector 170, manifold support 196, and manifold gas heating plate 150 may be made of the same material, for example quartz. Alternatively, other suitable materials may be used. For example, the manifold gas heating plate 150 may be made of quartz while the gas injector 170 is made of sapphire, or vice versa. The manifold support 196 may be made of any process resistant material and does not need to be transparent.

An inlet 180 formed in a surface of the manifold gas heating plate 150 facing the substrate support 140 fluidly communicates with an extending conduit 185 formed in the gas injector 170 to form a gas passage from the gas injector 170 into the manifold gas heating plate 150. One or more outlets 190 are also formed in the surface of the manifold gas heating plate 150 facing the substrate support 140, which here is the second major surface 167, to allow reaction precursors to flow from the manifold gas heating plate 150 into the processing volume 120. One or more channels are formed inside the manifold gas heating plate 150, between a first portion of the manifold gas heating plate 150 and a second portion, as described further below, providing a fluid passage from the inlet 180 to the outlets 190. As the reaction precursor flows through the channels, the heated manifold gas heating plate 150 heats the reaction precursor to an elevated temperature to promote reaction of the reaction precursors with the exposed surface of the substrate 104 when the reaction precursor exits the manifold gas heating plate 150 through the outlets 190. The extending conduit 185 may be sealed with an inner wall of the inlet 180 using a thermally resistant seal member disposed in the inlet 180 so that most or all reaction precursor(s) flowing through the gas injector 170 flow into the manifold gas heating plate 150.

One of the outlets 190 is shown in detail in FIG. 1B. The outlet 190 is an opening in a side of the manifold gas heating plate 150 that faces the substrate support 140 when installed in the chamber 100. The outlet 190 does not extend through the thickness of the manifold gas heating plate 150 from the first major surface 166 to the second major surface 167, but joins with a channel 195 formed between a first portion 176 of the manifold gas heating plate 150 and a second portion 177 of the manifold gas heating plate 150. The manifold gas heating plate 150 is formed by joining the first portion 176 and the second portion 177. The first portion 176 starts as a flat plate. The channels 195 are milled or etched into one side of the flat plate, and the outlets 190 and inlet 180 are formed in the other side of the flat plate, which becomes the second major surface 167 of the manifold gas heating plate 150 upon assembly of the manifold gas heating plate 150. The outlets 190 and inlet 180 intersect with the channels 195. The second portion 177 is then disposed on the first portion 176 covering the channels 195 and the two portions are joined, for example by welding, to form the manifold gas heating plate 150. Channels may also be formed in the second portion 177, optionally matching the channels of the first portion. Alternatively, the channels formed in the second portion 177 may have a different pattern from the channels formed in the first portion 176 to allow additional flow pathways through the manifold gas heating plate 150.

FIG. 1C shows a detailed view of a manifold 151, like the manifold gas heating plate 150, with an outlet 191 that is angled to direct gas flow in a desired direction. Like the outlet 190, the outlet 191 does not extend through the manifold 151 from the first major surface 166 to the second major surface 167 thereof, and connects with a channel 195 formed between the first major surface 166 and the second major surface 167 of the manifold 151. The outlet 191 has an axis 192 that is not perpendicular to either the first major surface 166 or the second major surface 167.

The manifold gas heating plate 150 and/or the divider 165 may be coated. The coatings may include optical coatings and/or passivation coatings. Optical coatings may be used to control transmissivity and reflectivity of the coated member. For example, a spectral notch filter coating may be used to reflect or absorb a specific wavelength or spectrum of electromagnetic radiation. Multiple such materials may be used in some cases to reflect or absorb selected wavelengths. Examples of such coatings include spectral notch filters. Anti-reflective materials can also be included in a coating, for example as an anti-reflective layer. The coatings may be applied to either or both major surfaces 166, 167 of the manifold gas heating plate 150 and/or the divider 165. On the manifold gas heating plate 150 and/or the divider 165, an anti-reflective coating may be applied to the first major surface 166 and a spectral notch filter coating may be applied to the second major surface 167.

In operation, a gas source is fluidly coupled to the gas injector 170. Reaction precursors are flowed into the gas injector 170, through the extending conduit 185 and inlet 180, into the manifold gas heating plate 150, through the manifold gas heating plate 150 and to the outlets 190. While travelling through the manifold gas heating plate 150, the reaction precursors are heated by the manifold gas heating plate 150 to a temperature near, at, or above an activation temperature. When the reaction precursors exit the manifold gas heating plate 150 into the processing volume 120, the reaction precursors are reactive at all locations along the substrate 104. A second reaction precursor is provided through the second opening 126. The second reaction precursor may be heated to some extent, or may be provided at ambient temperature. By virtue of the preheating of the reaction precursor in the manifold, the first gas is at its activation temperature when it exits the manifold, and thus is able to immediately react with the second gas at a location adjacent to the substrate to form the a film, or modify the exposed surface, on the substrate. In one embodiment, the first gas is hydrogen and the second gas is oxygen. The hot, active hydrogen reacts in the processing volume 120 with the oxygen to form reactive species that react with the surface of a semiconductor substrate in the processing chamber 100. The reactive species include oxygen radicals and hydroxyl radicals that have increased reactivity to react with silicon and/or germanium in the substrate surface. Some hydrogen radicals are also added to the substrate surface, either within the substrate below the surface or become attached to the surface Gas is exhausted from the processing chamber 100 through a port (not shown) located in the side wall of the portion of the chamber 100 removed by the cross-section of FIG. 1A. The exhaust is typically located approximately opposite the second opening 126, and may be located inside a passage formed in the side wall, and through which substrates are loaded and unloaded.

Figure 2A:
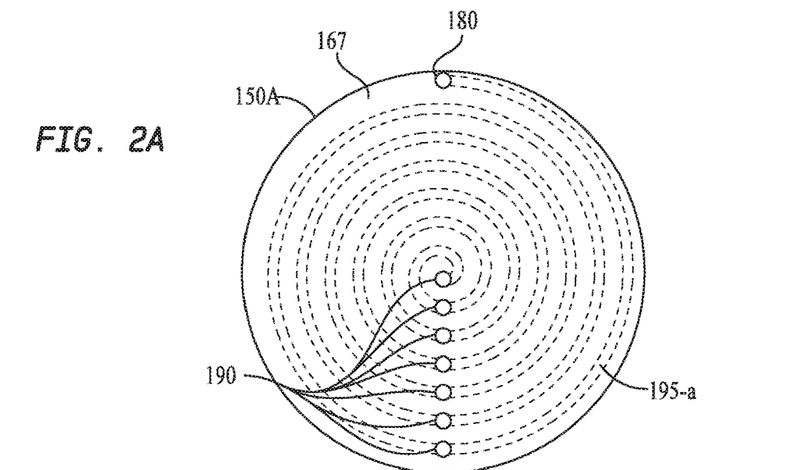
FIGS. 2A-2F are bottom views of manifold embodiments for thermal processing chambers.

FIGS. 2A-2F show various embodiments of manifolds 150A-150F, viewing the second major surface 167 of each. Each embodiment includes at least one inlet 180, several outlets 190, and channels 195-a through 195-f. The channels 195-a through 195-f are inside the manifolds 150A-F, between the first major surface 166 (not shown) and the second major surface 167, so the channels 195-a through 195-f are depicted in phantom. Each embodiment of the manifold gas heating plate 150 has a first side that is flat, and faces the divider 165 when the manifold gas heating plate 150 and divider 165 are installed in the chamber 100, and a second side with one or more inlets 180 and one or more outlets 190. The manifold gas heating plate 150A has a single inlet 180 fluidly coupled to a spiral channel 195-a inside the manifold gas heating plate 150A. The spiral channel 195-a has a constant convergence (the spacing between neighboring passes of the spiral channel 195-a through a given radius of the manifold gas heating plate 150A is constant), and multiple outlets 190 intersect the spiral channel 195-a at various points along the spiral channel 195-a. The spiral channel 195-a thus has the shape of an Archimedes spiral. The outlets 190 in FIG. 2A are arranged in a line, for example a straight line, along a radius of the manifold gas heating plate 150A, on the side of the manifold gas heating plate 150A opposite the inlet. Each pass of the spiral channel 195-a across a diameter of the manifold gas heating plate 150A drawn through the inlet 180 intersects with an outlet 190 along the diameter on an opposite side of the center from the inlet 180. In this case, the spiral channel 195-a ends at an outlet 190 near the center of the manifold gas heating plate 150A.

Figure 2B:
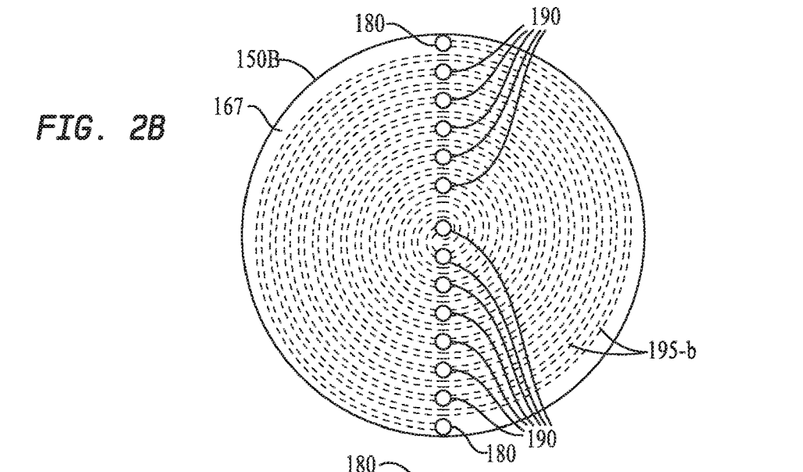

The manifold gas heating plate 150B of FIG. 2B has two inlets 180 located along a diameter of the manifold gas heating plate 150B at opposite edges of the manifold gas heating plate 150B. Each inlet 180 is fluidly coupled to a spiral channel 195-b. The manifold gas heating plate 150B has two inter-circling spiral channels 195-b, each having the same constant convergence to avoid the two spiral channels intersecting. A plurality of outlets 190 extend through the second major surface 167 of the manifold gas heating plate 150B, in this case arranged along a diameter of the manifold gas heating plate 150B, and they intersect with the spiral channels 195-*b* located within the manifold gas heating plate 150B. A first plurality of outlets 190 are fluidly coupled to a first spiral channel 195-*b* and a second plurality of outlets 190 are fluidly coupled to a second spiral channel 195-*b*. On each side of the center of the manifold gas heating plate 150B, along the diameter of the manifold gas heating plate 150B, is an inlet 180 near the edge of the manifold gas heating plate 150B and a plurality of outlets 190. The outlets 190 are arranged between the inlets 180 and outlets 190 on one side of the center of the manifold gas heating plate 150B are all connected to the same spiral channel 195-*b*. The number of outlets 190 on each side of the center of the manifold gas heating plate 150B is different in this case, but the number may be the same.

A manifold with two inlets 180, like the manifold gas heating plate 150B of FIG. 2B, may be used in the chamber 100 of FIG. 1A by providing a second opening like the opening 169 in the side wall of the chamber body 102 where the recess that accommodates the manifold support 196 is shown, and by providing a second gas injector like the gas injector 170 in the second opening. The second gas injector would have a port like the extending conduit 185 for engaging with the second inlet 180 of the manifold. A gas source would be connected to each gas injector 170, and reaction precursors would flow into the manifold gas heating plate 150B from two opposite sides of the chamber 100. Such a manifold would allow flowing two different reaction precursors through the manifold gas heating plate 150B for heating via separate pathways prior to injecting into the processing volume 120. Where multiple channels are formed in the manifold, the channels may have the same length or different length.

Figure 2C:
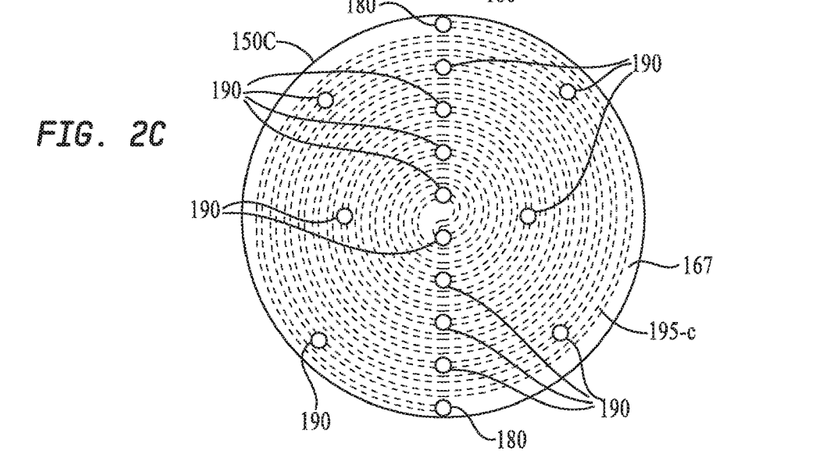

FIG. 2C shows a manifold gas heating plate 150C like the manifold gas heating plate 150B, but with outlets 190 not all arranged along a diameter of the manifold gas heating plate 150C. The manifold gas heating plate 150C is also different from the manifold gas heating plate 150B in that only one channel 195-*c* is provided, here with two inlets 180 at opposite edges along a diameter of the manifold gas heating plate 150C, as with the manifold gas heating plate 150B. The channel 195-*c* is a double-spiral channel forming a path that converges from the inlets 180 toward the center of the manifold gas heating plate 150B at a constant convergence. The outlets 190 are defined at symmetrical locations with respect to a diameter intersecting the inlets 180, with the same number of outlets 190 for each converging segment of the spiral channel 195-*c*.

Figure 2D:
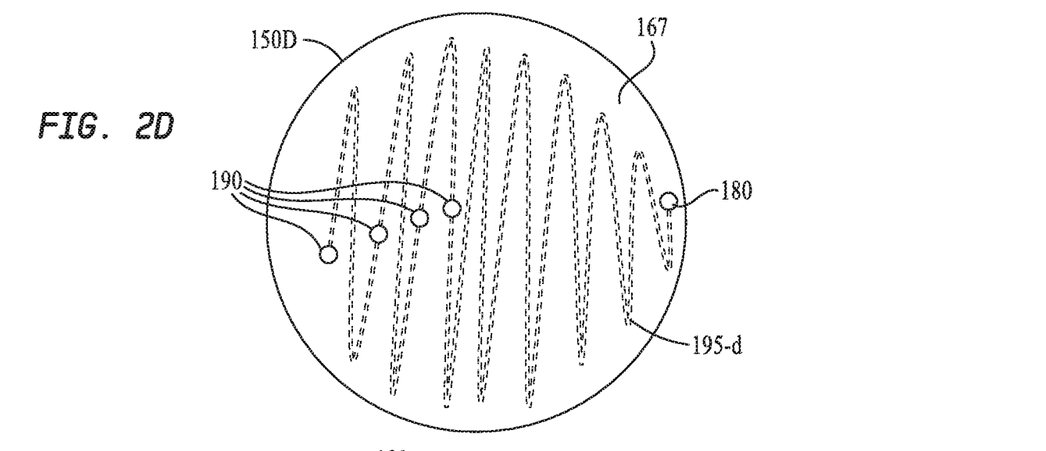

FIG. 2D shows a manifold gas heating plate 150D with an irregular channel 195-*d* formed in a back-and-forth pattern through the manifold gas heating plate 150D. One inlet 180 is provided, and multiple outlets 190 are provided on an opposite side of the manifold gas heating plate 150D from the inlet 180. The manifold gas heating plate 150D illustrates that the channel(s) 195 may be provided in any configuration to allow time for reaction precursors to absorb heat from the manifold gas heating plate 150 and allow the temperature thereof to rise to an elevated temperature.

Figure 2E:
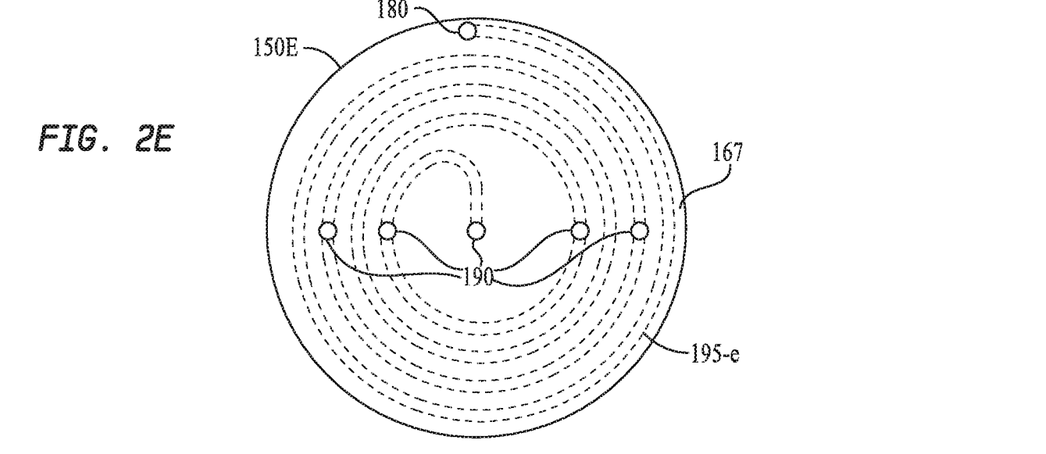

FIG. 2E shows a manifold gas heating plate 150E with a spiral channel 195-*e* that has circumferential passes thereof formed in a peripheral portion of the manifold gas heating plate 150E but not in a central portion thereof. A loop of the channel 195-*e* proceeds from the last pass of the spiral around the manifold gas heating plate 150E, located partway from the center to the periphery of the manifold gas heating plate 150E, to the center of the manifold gas heating plate 150E. Such a configuration may be used if the residence time of reaction precursors achievable by using a full spiral is not needed. The outlets 190 in manifold gas heating plate 150E are also arranged along a diameter that does not include the inlet 180, but in this case is perpendicular to a diameter that includes the inlet 180.

Figure 2F:
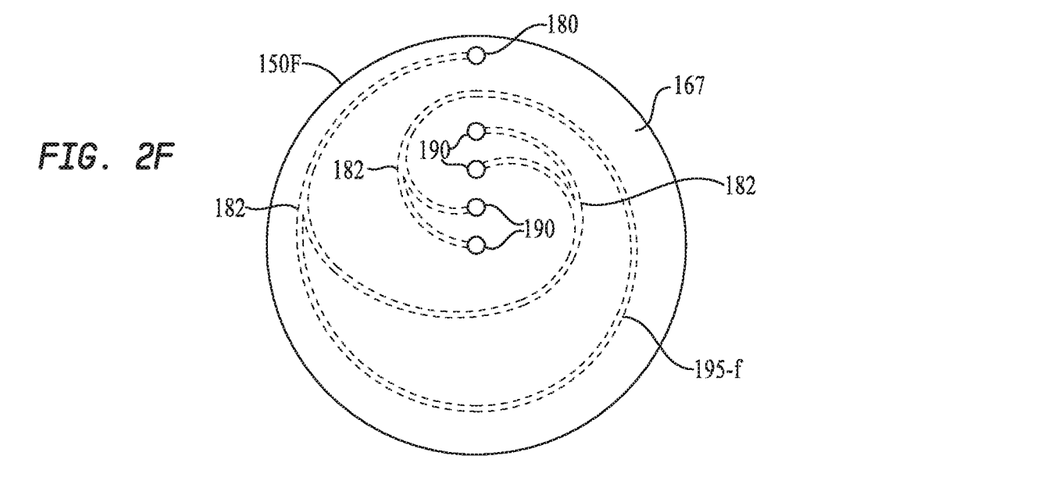

FIG. 2F shows a manifold gas heating plate 150F with a spiraloid channel 195-*f* that includes branches 182. The channel 195-*f* proceeds from the inlet 180 to a first branch point 182 where the channel 195-*f* divides into two branches. Each branch continues along a spiraloid path through the manifold gas heating plate 150F to a second branch point 182, one for each branch. Each second branch point divides the branch into two sub-branches, for a total of four sub-branches. Each sub-branch ends at an outlet 190. The manifold gas heating plate 150F illustrates how branched channels may be implemented in a manifold gas heating plate 150. It should be noted that channels and branches may also converge in a manifold gas heating plate 150 at one or more convergence points.

Figure 3A:
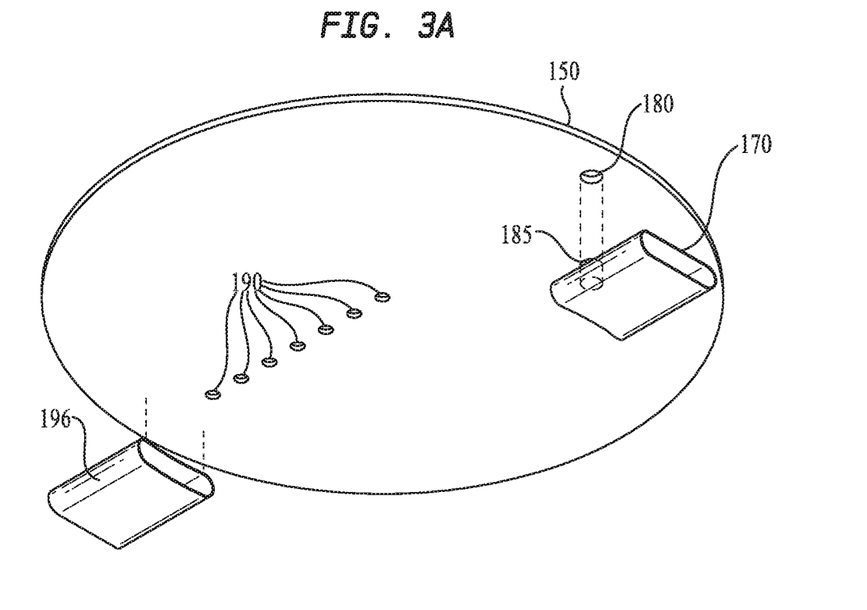
FIG. 3A is an exploded perspective view of a manifold, gas injector, and manifold support, according to one embodiment.

FIG. 3A is an exploded perspective view of the manifold gas heating plate 150, the gas injector 170 and the manifold support 196 showing the positions each member has when installed in the chamber 100. Upon installation, the gas injector 170 is inserted into the opening 169 (FIG. 1A), and the manifold support 196 is inserted into the recess opposite the opening 169 (FIG. 1A) from the inside the chamber processing volume 120. The manifold gas heating plate 150 is then disposed on the gas injector 170 and the manifold support 196 so that the inlet 180 fits over the extending conduit 185. The junction of the extending conduit 185 and the inlet 180 may be sealed using a thermally resistant seal member disposed between the extending conduit 185 and the inner wall of the inlet 180. In the event a two-injector embodiment is used, a second gas injector 170 may be inserted into a second opening like the opening 169 that would be located where the recess is shown in FIG. 1A, and both openings 169 would fit over a respective pas injector. Each injector may be sealed to the manifold as described above. Other sealing and connection mechanisms, such as snap rings, o-rings, threads, and plugs, can be used under appropriate conditions to minimize or eliminate leakage of gas at the coupling between the extending conduit 185 and the inlet 180. Alternatively, the extending conduit 185 may just align with the inlet 180 without forming a seal so that a stream of gas flows out of the extending conduit 185 toward the inlet 180, crosses a gap between the extending conduit 185 and the inlet 180, and substantially flows into the inlet 180.

Figure 3B:
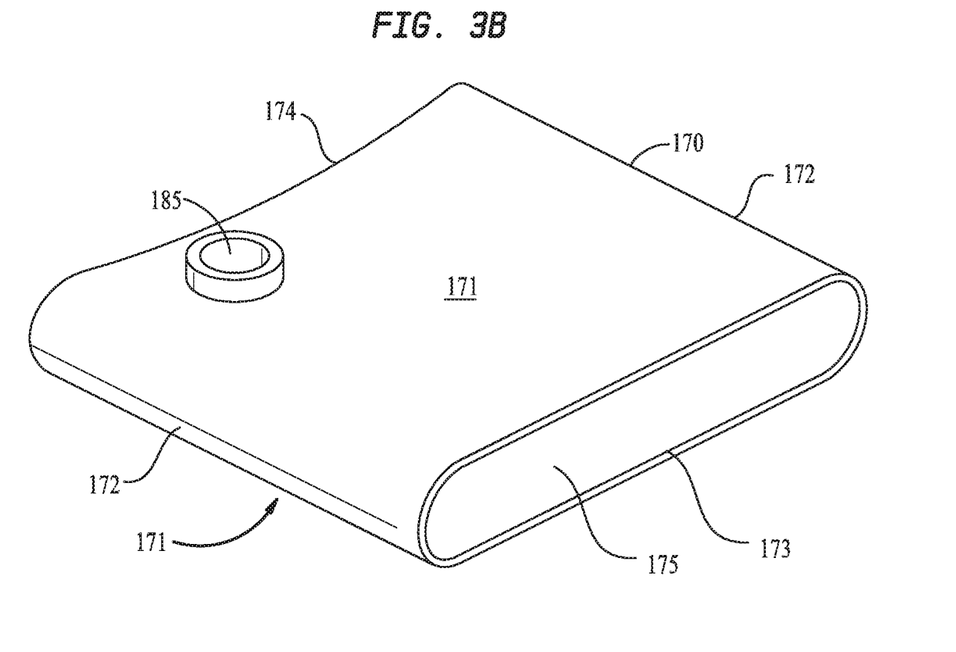
FIG. 3B is an isometric view of a gas injector according to one embodiment.

FIG. 3B is an isometric view of a gas injector 170 according to one embodiment. The gas injector 170 has two flat sides 171 connected by rounded side walls 172 and a gas inlet 175 at a first end 173 of the gas injector 170. The gas inlet 175 is an opening that defines a plane substantially perpendicular to a central axis of the gas injector 170, the central axis defining a gas flow direction through the gas injector 170. A second end 174 of the gas injector 170, opposite from the first end 173, is closed off. The extending conduit 185 is located near the second end 174 of the gas injector 170, between the first end 173 and the second end 174 thereof, to provide connection or engagement with the inlet 180 of the manifold gas heating plate 150. The second end 174 may have a concave rounded shape consistent with the circular shape of the processing volume 120 and the substrate support 140 (FIG. 1A). Other shapes of gas injectors 170 are envisioned. For example, the gas injector 170 may be a tube that runs through a circular opening of the side wall of the chamber body 102 and into the inlet 180 of the manifold. In another example, the gas injector 170 may have an elongated inlet like the gas inlet 175 at the first end 173 as shown in FIG. 3B, and may narrow at the second end 174 to a tube that turns to connect with or engage with the inlet 180 of the manifold gas heating plate 150.

Figure 3C:
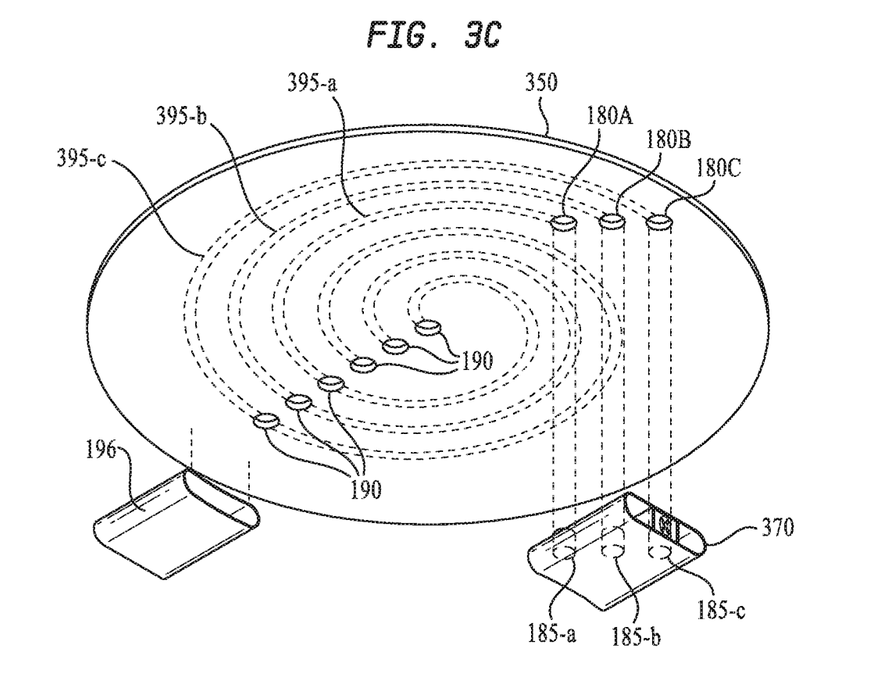
FIG. 3C is an exploded perspective view of a manifold, gas injector, and manifold support, according to another embodiment.

FIG. 3C is an exploded perspective view of a manifold 350, a gas injector 370 and a manifold support 196. The gas injector 370 is different from the gas injector 170 in that the gas injector 370 has three extending conduits 185-*a* through 185-*c* that each engage with a respective inlet 180A-C of the manifold 350. Each of the three extending conduits 185 is located between the first end 173 and the second end 174 of the gas injector 370. Each inlet 180A-C fluidly couples to a respective one of the spiral channels 395-*a* through 395-*c* connected to outlets 190. The assembly of FIG. 3C provides three separate channels, and thus three separate gas pathways, in the manifold 350 to segregate three gases for heating thereof before they enter the processing volume 120.

Figure 3D:
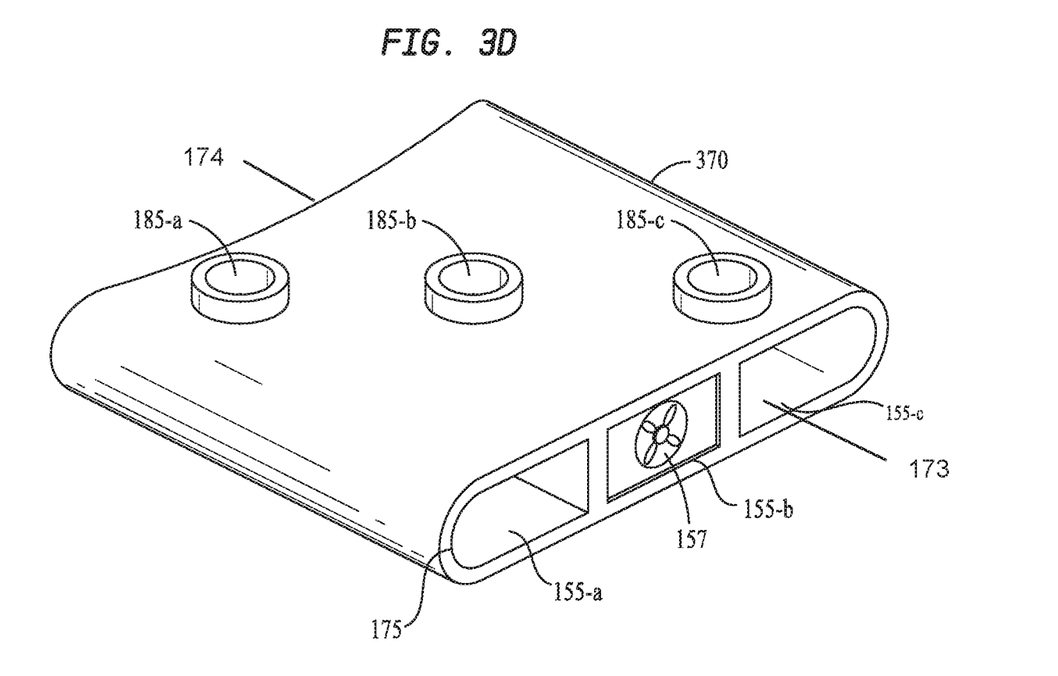
FIG. 3D is an isometric view of a gas injector according to another embodiment.

FIG. 3D is an isometric view of the gas injector 370 of FIG. 3C. The gas inlet 175 of the gas injector 370 is divided into a plurality of separate gas lines 155-*a* to 155-*c*. In this case, the gas inlet 175 has three separate gas lines 155-*a* through 155-*c*, each fluidly coupling with a different one of the three ports 185-*a* through 185-*c*. The ports 185-*a* through 185-*c* are staggered to allow engagement with both the gas lines 155-*a* through 155-*c* and the inlets 180A-C, which extend in directions that are at right angles to each other. Separate gas pathways coupled to the separate gas lines 155-*a* through 155-*c* allow a plurality of separate gases, or separate gas mixtures, to flow into the gas inlet 175, and through the manifold 350, separately, if desired. A flow regulator 157 may be provided in one or more of the gas lines 155-*a* through 155-*c* to allow flow rate control of reaction precursors into the chamber. As illustrated in FIG. 3D, the gas line 155-*b* has a flow regulator 157.

Figures 4A, 4C:
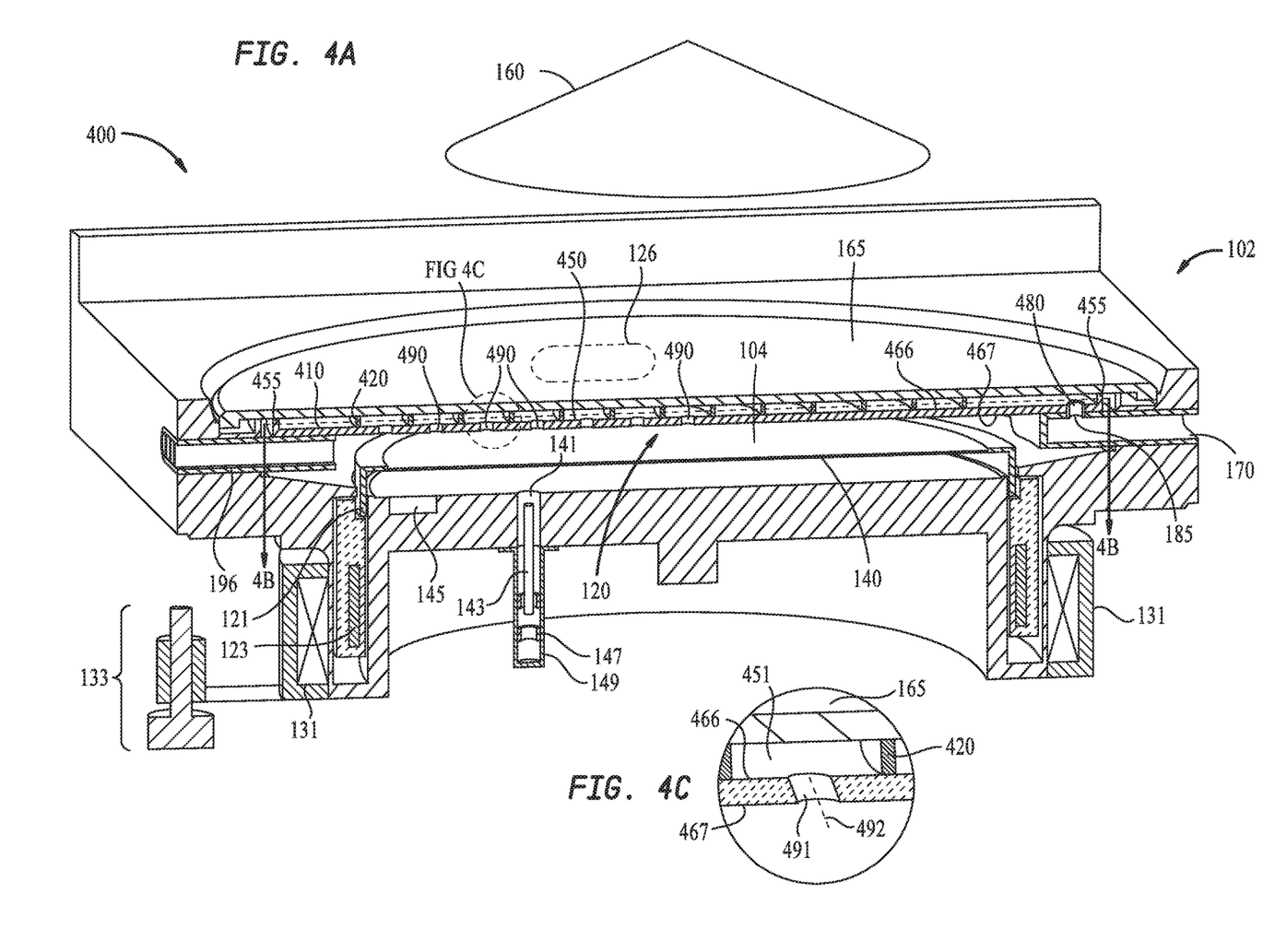
FIG. 4A is a perspective cross-sectional view of another thermal processing chamber.
FIG. 4C is a detailed view of the blocker plate of FIG. 4B.

FIG. 4A is a perspective cross-sectional view of a chamber 400 according to another embodiment. The chamber 400 is similar to the chamber 100 in many respects, and identical features in the two chambers are labelled identically. The chamber 400 is different from the chamber 100 in how gas flows from the gas injector 170 to the processing volume 120. Instead of a manifold gas heating plate 150, a blocker plate 450 is used as the gas heating plate, and gas flows between the blocker plate 450 and the divider 165 to be heated by the blocker plate 450 and the divider 165. The blocker plate 450 has a first major surface 466 and a second major surface 467, with the second major surface 467 facing the substrate support when the blocker plate 450 is installed in the chamber 400.

The blocker plate 450 has an opening 480 that extends through the blocker plate 450 from the first major surface 466 to the second major surface 467 thereof allowing gas to flow from the extending conduit 185, through the blocker plate 450, and to a plenum 410 between the blocker plate 450 and the divider 165. The blocker plate 450 includes a plurality of baffles 420 extending from the blocker plate 450 toward the divider 165 to create flow pathways through the plenum 410. Gas flows through the opening 480 into the plenum 410 along the pathways formed by the baffles 420 to absorb heat from the blocker plate 450 and the divider 165. A plurality of ports 490 is formed in the blocker plate 450 to allow gas to flow from the plenum 410 to the processing volume 120.

The blocker plate embodiment of FIG. 4A is similar in concept to the manifold embodiment of FIG. 1A in that a gas flows along a pathway that subjects the gas to heating before the gas enters the processing volume. In both embodiments, the gas is heated by contact with hot surfaces of the pathway, which are heated in turn by the heat source 160. Injection of the second gas through the second opening 126 is the same, and gas exhaust from the chamber 400 is the same, as the chamber 100. The blocker plate 450 may also be made of materials substantially transparent to the electromagnetic radiation emitted by the heat source 160. The blocker plate 450 may also have coatings on the first and second major surfaces thereof 466 and 467, as described above for the manifold gas heating plate 150.

The blocker plate 450 of FIG. 4A and the divider 165 may form a single body. The blocker plate 450 may be formed with baffles, and then the divider 165 may be permanently attached to the baffles, for example using adhesive or by welding. Alternatively, grooves may be formed in the divider 165 to receive the baffles 420 of the blocker plate 450 to provide sealing of the gas flow pathway in the plenum 410.

Figure 4B:
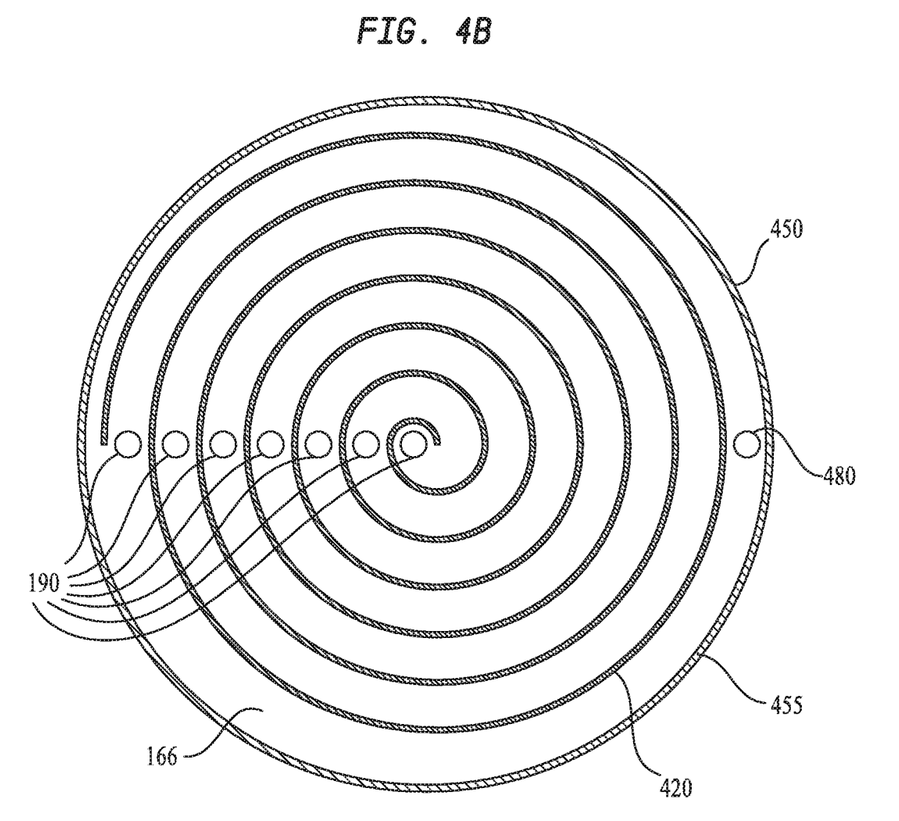
FIG. 4B is a top view of a blocker plate usable in the thermal processing chamber of FIG. 4A.

FIG. 4B is a top view of the blocker plate 450, showing the openings 180 and 190 and the baffle 420. In FIG. 4B, one spiral baffle 420 is shown. The blocker plate 450 has a rim 455, which is raised like the baffle 420 and contacts the divider 165, as shown in FIG. 4A. The rim 455 provides sealing at the edge of the blocker plate 450 so gas flowing through the opening 180 is forced to flow through the plenum 410, through the openings 490, and into the processing volume 120. The divider 165 may also have a groove to receive the rim 455. As with the various embodiments of the manifold gas heating plate 150, the blocker plate 450 may have various configurations of baffles and openings to provide any desired flow pattern through the plenum 410 between the blocker plate 450 and the divider 165.

The blocker plate 450 differs from the manifold gas heating plate 150 chiefly in that the surface of the blocker plate 450 that faces the divider 165 when installed has a number of features, where the same surface of the manifold gas heating plate 150 is flat. The blocker plate 450 has openings that extend from the first major surface 166 to the second major surface 167 through the thickness of the blocker plate 450, whereas the manifold gas heating plate 150 has openings only on one side, the side facing the substrate support 140 when installed. The blocker plate 450 also has baffles on the side facing the divider 165, which here is the first major surface 466, where the manifold gas heating plate 150 has no such baffles. The blocker plate 450 and the manifold plate 150 are both embodiments of a plate that defines gas flow conduits, the channels 195 of the manifold gas heating plate 150 and the plenum 410 of the blocker plate between the baffles 420. The gas flow conduits of both types form a heating space for gas flowing to the processing volume 120.

The outlets 190 described in connection with the various embodiments of the manifolds 150, and the openings 490 described in connection with the blocker plate 450, may be shaped to direct gas flow in a desired direction into the processing volume 120. FIG. 4C shows a detailed view of a blocker plate 451, like the blocker plate 450, with an opening 491 that is angled to direct gas flow in a desired direction. Like the opening 490, the opening 491 extends through the blocker plate 451 from the first major surface 466 to the second major surface 467, fluidly coupling the plenum 410 to the processing volume 120. The opening 491 has an axis 492 that is not perpendicular to either the first major surface 466 or the second major surface 467.

Angling the outlets 191 and openings 491 with respect to the first and second major surfaces 166, 167 or 466, 467 allows directing gas flow in a selected direction or to a desired radial location on the substrate 104. The outlets 190, 191, and openings 490, 491 may also have a shaped flow pathway to influence divergence of the gas upon exiting the outlets 190, 191 and openings 490, 491. For example, the outlets 190, 191 and openings 490, 491 may have a diameter that increases toward an exit point of the outlet 190, 191 or opening 490, 491 to promote spreading of the gas entering the processing volume 120. In other aspects, the outlets 190, 191 and openings 490, 491 may have shapes that are not circular. For example, some or all the outlets 190, 191 and openings 490, 491 could be elongated in a direction along the second major surface 167 in the case of the outlets 190, 191, and along the first and/or second major surfaces 466, 467 in the case of the outlets 490, 491.

While resident in the manifold gas heating plate 150, and/or between the blocker plate 450 and the divider 165, reaction precursors are heated by the manifold gas heating plate 150, or blocker plate 450 surfaces heated by the heating source 160. Increasing the length of the channel 195 will increase in residence time of the reaction precursors at a given flow rate. An increased residence time of the reaction precursors in the manifold gas heating plate 150 or the blocker plate 450 will, therefore, correlate with an increased temperature of the gas prior to it flowing into the processing volume 120. For example, in some embodiments the length of the channel(s) 195, or the flow path through the plenum 410, and power of heating source 160 are selected to provide heating of the reaction precursor to above 400° C., which can activate hydrogen gas for a semiconductor oxidation process that uses hydrogen gas and oxygen gas to form reactive species that react with the substrate surface. Residence time can also be influenced by flow rate through the channel(s) 195 or the plenum 410. The reaction precursor to be heated can be diluted using a carrier gas to adjust the flow rate (Q) thereof through the channel(s) 195 or the plenum 410 to achieve a desired residence time for heating of the precursor gas independent of the flow rate through the channel(s) 195 or the plenum 410. The manifold gas heating plate 150 may have a convex or concave curvature on one or both sides thereof in some cases. The blocker plate 450 may likewise have a similar convex or concave curvature, and the divider 165 may be curved to match, or the baffles may have dimensions that provide a flat contact plane for engaging with the divider 165.

Figure 5:
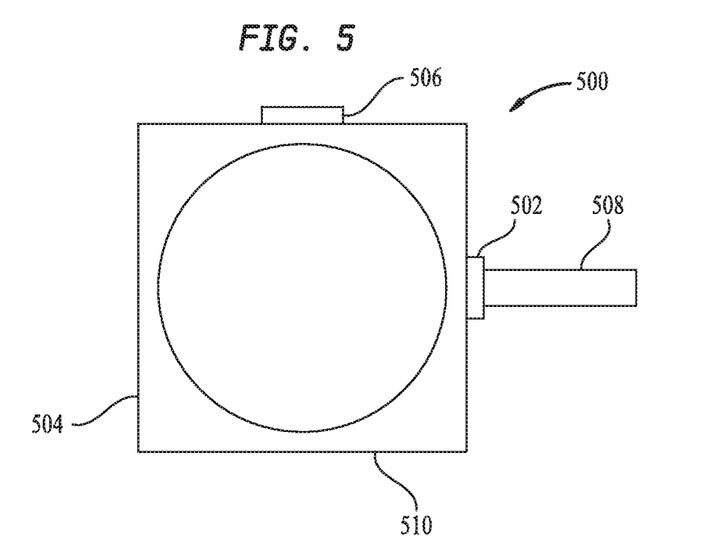
FIG. 5 is a schematic top view of another thermal processing chamber.

FIG. 5 is a schematic top view of a processing chamber 500 according to another embodiment. The processing chamber 500 is like the processing chambers 100 and 400, but the processing chamber 500 accomplishes heating of a precursor gas in another way. The processing chamber 500 has a first gas inlet 502 at a first location through a side wall 504 of the chamber 500 and a second gas inlet 506 at a second location through the side wall 504. The second location is azimuthally spaced at an angle of about 90° from the first location. A substrate access door 510 is opposite the second gas inlet 506, and an exhaust (not shown) is located within the chamber body adjacent to the substrate access door 510. Instead of the gas injectors and plates of the chambers 100 and 400, a gas heater 508 is coupled to the first gas inlet 502 to heat the gas flowing to the first gas inlet 502. The gas heater 508 directly heats a gas flowing into the first gas inlet 502 of the chamber 500. The gas heater 508 may be a resistive heater or a heat exchanger having a high surface area for contacting the gas flowing through the gas heater 508.

While the foregoing is directed to embodiments of the present invention, other and further embodiments of the invention may be devised without departing from the basic scope thereof, and the scope thereof is determined by the claims that follow.

What is claimed is:

1. A gas injection apparatus for a processing chamber comprising:
    a gas injector having an inlet at a first end, a closed second end, and an extending conduit located between the first end and the second end; and
    a transparent manifold plate gas heater having an inlet that matches and fluidly couples to the extending conduit, one or more outlets, and one or more channels formed in the manifold plate gas heater and fluidly connecting the inlet of the manifold to the one or more outlets.

2. The gas injection apparatus of claim 1, wherein the one or more channels are circuitous pathways disposed through the manifold plate gas heater.

3. The gas injection apparatus of claim 1, wherein the manifold plate gas heater comprises at least two channels, and the at least two channels have different lengths.

4. The gas injection apparatus of claim 1, wherein at least one of the one or more channels is branched.

5. The gas injection apparatus of claim 1, wherein the one or more outlets are arranged in a line extending from a center of the manifold to a periphery of the manifold plate gas heater.

6. The gas injection apparatus of claim 1, wherein the gas injector comprises a plurality of gas lines.

7. The gas injection apparatus of claim 6, wherein the gas injector further comprises a plurality of ports, each fluidly coupled to one of the plurality of gas lines, and the manifold plate gas heater comprises:
    a plurality of inlets, each matching one of the plurality of ports of the gas injector; and
    a plurality of channels, each fluidly connected to one of the plurality of inlets of the manifold.

8. The gas injection apparatus of claim 1, wherein the gas inlet at the first end of the gas injector is elongated.

9. The gas injection apparatus of claim 1, wherein the gas injector is disposed below the manifold plate gas heater.

10. The gas injection apparatus of claim 1, wherein the gas injector is transparent.

11. A gas injection apparatus for a processing chamber comprising:
    a gas injector having an inlet at a first end, a closed second end, and an extending conduit located between the first end and the second end; and
    a manifold plate having a first surface and a second surface opposite the first surface, the manifold plate comprising:
        an inlet extending from the second surface to the first surface and coupled to the extending conduit, wherein the gas injector is disposed adjacent to the second surface;
        one or more outlets extending from the second surface to the first surface; and
        one or more channels formed in the first surface connecting the inlet of the manifold plate to the one or more outlets.

12. The gas injection apparatus of claim 11, wherein the one or more channels comprise circuitous pathways.

13. The gas injection apparatus of claim 11, wherein the manifold plate gas heater comprises at least two channels, and the at least two channels have different lengths.

14. The gas injection apparatus of claim 11, wherein at least one of the one or more channels is branched.

15. The gas injection apparatus of claim 11, wherein the one or more outlets are arranged in a line extending from a center of the manifold plate gas heater to a periphery of the manifold plate gas heater.

16. The gas injection apparatus of claim 11, wherein the gas injector comprises a plurality of gas lines.

17. The gas injection apparatus of claim 16, wherein the gas injector further comprises:
- a plurality of ports, each port fluidly coupled to one of the plurality of gas lines, and the manifold plate gas heater comprises:
  - a plurality of inlets, each matching one of the plurality of ports of the gas injector; and
  - a plurality of channels, each fluidly connected to one of the plurality of inlets of the manifold.

18. The gas injection apparatus of claim 11, wherein the inlet at the first end of the gas injector is elongated.

19. The gas injection apparatus of claim 11, wherein the gas injector is disposed below the manifold plate gas heater.

20. The gas injection apparatus of claim 11, wherein the gas injector is transparent.

\* \* \* \* \*